(12) United States Patent
Chivers et al.

(10) Patent No.: US 8,001,167 B2
(45) Date of Patent: Aug. 16, 2011

(54) AUTOMATIC BNE SEED CALCULATOR

(75) Inventors: Mark Allen Chivers, Mckinney, TX (US); Sujit Ravindran, Dallas, TX (US)

(73) Assignee: L3 Communications Integrated Systems, L.P., Greenville, TX (US)

( * ) Notice: Subject to any disclaimer, the term of this patent is extended or adjusted under 35 U.S.C. 154(b) by 899 days.

(21) Appl. No.: 11/967,404

(22) Filed: Dec. 31, 2007

(65) Prior Publication Data
US 2009/0171632 A1    Jul. 2, 2009

(51) Int. Cl.
    *G06F 7/00*    (2006.01)
(52) U.S. Cl. ....................................... 708/200
(58) Field of Classification Search ................... 708/200
    See application file for complete search history.

(56) References Cited

U.S. PATENT DOCUMENTS

| | | | |
|---|---|---|---|
| 4,249,177 A | 2/1981 | Chen | |
| 5,257,211 A | 10/1993 | Noga | |
| 5,539,682 A * | 7/1996 | Jain et al. ...................... | 708/200 |
| 6,556,967 B1 | 4/2003 | Nelson et al. | |

* cited by examiner

*Primary Examiner* — Tan V Mai
(74) *Attorney, Agent, or Firm* — Hovey Williams LLP

(57) ABSTRACT

An automatic background noise estimator (BNE) seed calculator for determining a starting point for a BNE circuit which tracks the noise floor received by a receiver. The BNE seed calculator may sample a plurality of data points from the receiver and calculate the magnitude of each point. The seed calculator may then determine the peak magnitude value, a plurality of mean values, and the variance of the sampled points. A plurality of lookup tables are used to compare the peak, mean, and variance values with simulated peak, mean, and variance values to estimate the noise floor level of the actual signal and use that to determine the optimum BNE seed value. Simulation software such as MATLAB is used to develop the lookup tables by simulating peak, mean, and variance values based on a plurality of signal-to-noise ratios (SNR).

21 Claims, 4 Drawing Sheets

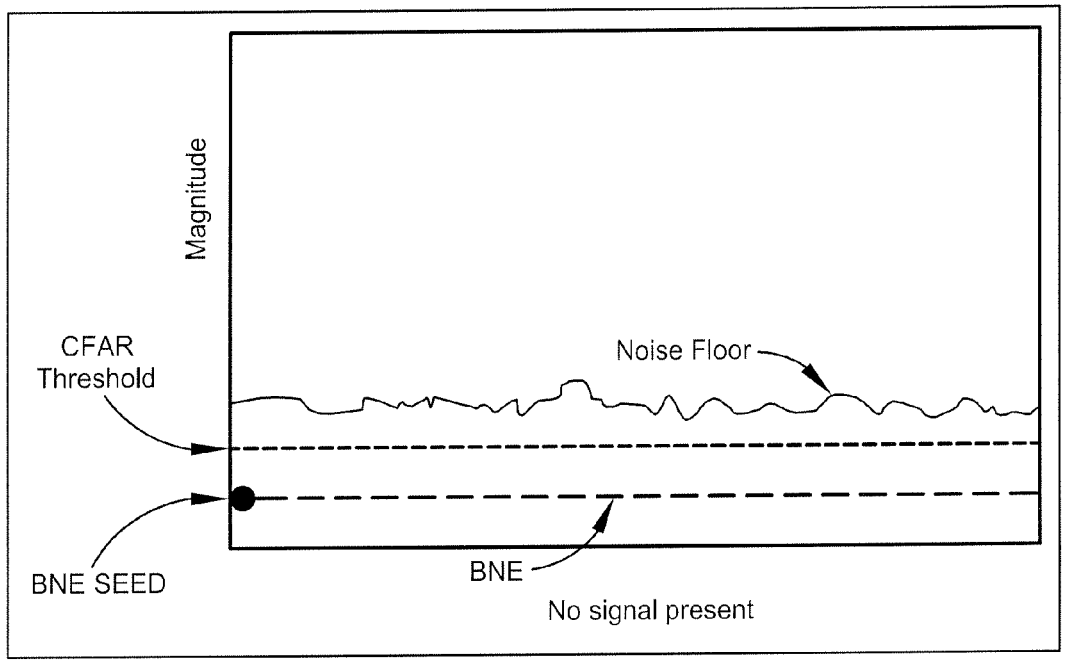
Fig. 1 (Background)
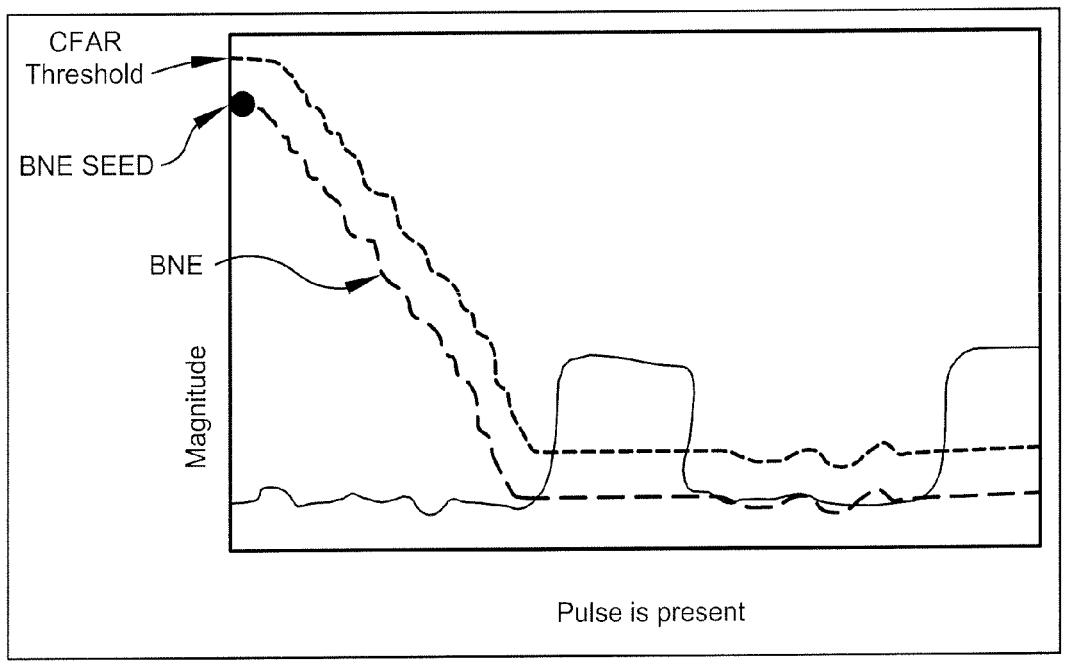
Fig. 2 (Background)

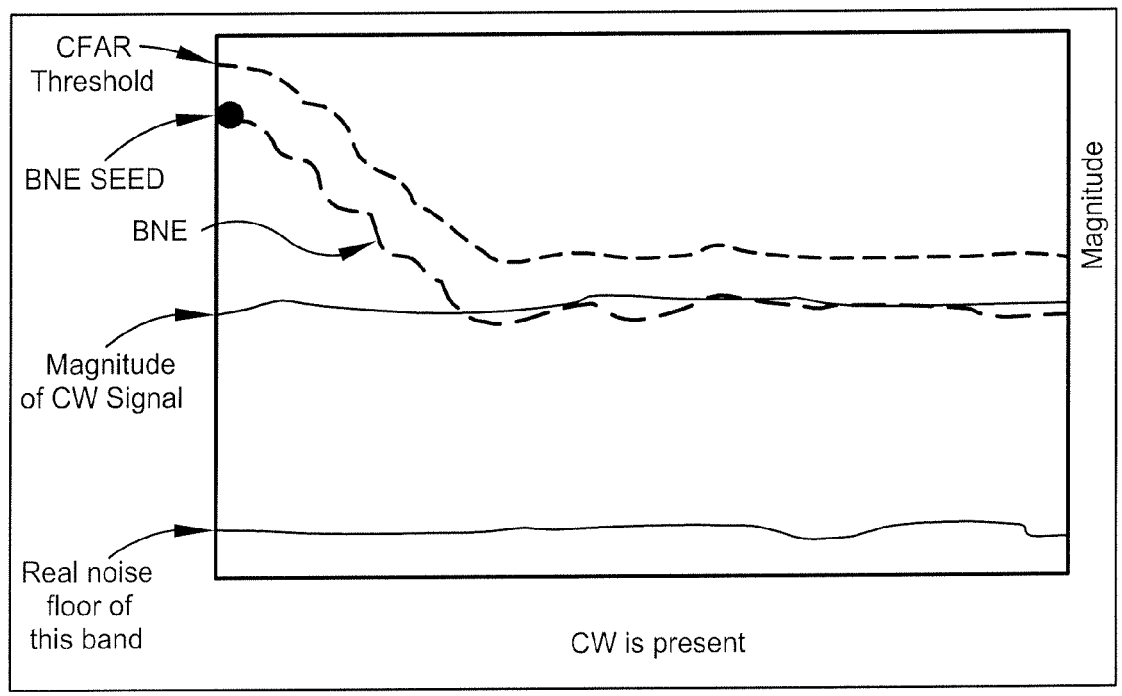
*Fig. 3 (Background)*

AUTOMATIC BNE SEED CALCULATOR

BACKGROUND

1. Field

The present invention relates to field programmable gate array (FPGA) circuits. More specifically, the present invention relates to a circuit which can automatically determine the starting point (or seed) for a background noise estimator (BNE) circuit of an FPGA circuit.

2. Related Art

Most known receivers use a Constant False Alarm Rate (CFAR) circuit to detect signals. The CFAR threshold is set to be a certain decibel level above the noise floor which is typically tracked with a Background Noise Estimator (BNE) circuit. A signal is detected when the magnitude level rises above the CFAR threshold and measurements or demodulation are then triggered. The BNE circuit is prevented from adjusting during a detection so that the estimated noise floor will not adjust upwards to the detected signal level.

A problem with BNE circuits is that they typically lose track of the noise floor when the receiver front end is tuned to a different frequency band. This problem is due to switching noise, local oscillator settling times, large jumps in the noise floor level, and tuning into a large continuous wave (CW) signal. This can cause a significant increase in false alarms or failed detections even though a signal is present.

A solution to this problem is to use a manual seed (starting point for tracking noise floor) that is input into the BNE to restart the BNE at a particular noise floor level. Currently, this is done manually by adjusting fixed thresholds until an acceptable false alarm rate is reached. Then the BNE seed is selected to be about 3 dB below that point. Another solution is to have a pre-determined BNE seed that is a typical value for each band. The first method is very cumbersome and time consuming, and the second method does not always work in real operating conditions so it can also have the problem of increased false alarms or failed detections. The BNE seed may be picked too high, picked correctly, or too low.

In FIG. 1, the BNE seed has been picked too low. The receiver will instantly start a detection since the BNE does not change during a detection. The receiver will collect data throughout the collection period (or dwell) even though only noise is present.

In FIG. 2, the BNE seed is picked high. In this case, since there is a pulse noise present, the BNE will track down to the noise floor and good detection will result. The BNE would also track in this scenario even if only noise would have been present. However, because the BNE seed is picked high, it takes more time for the BNE to track down to the noise floor.

In FIG. 3, the BNE seed is once again picked too high, but there is a continuous wave (CW) signal present in the band. The BNE will track down and adjust to the magnitude of the CW signal as if it were the noise floor. No CW signal will be detected, thus no data will be collected.

Accordingly, there is a need for an improved method of determining a BNE seed value that does not suffer from the problems and limitations of the prior art.

SUMMARY

The present invention provides an improved method and apparatus for an FPGA circuit that will accurately determine the noise floor in any tuned band regardless of the signals present and convert that calculated value into an accurate seed value for a conventional BNE circuit.

The circuit of the present invention is designed to collect a plurality of data points and convert the data points into the frequency domain to determine the actual magnitudes of the data points. The circuit then calculates a series of actual mean values for the magnitude values, wherein each successive actual mean is calculated as the actual mean of the values below the preceding calculated actual mean value. The final actual mean and the points below this actual mean are used to calculate an actual variance of the remaining actual magnitudes. The purpose of these actual means is to minimize the effect of the spectral energy of any pulses or CW signals that may be present.

The circuit of the present invention also may comprise a peak detector for identifying an actual peak magnitude, which is the largest actual magnitude value of the data points. An actual threshold value is calculated as the difference between the actual peak magnitude and the first calculated actual mean value of the magnitudes. The actual peak magnitude and the actual threshold value are then compared with values in a memory-stored lookup table having a plurality of 0 dB signal-to-noise ratio (SNR) simulated peak magnitudes and corresponding simulated threshold values to determine if the signal is a "noise-only" case or a "signal present" case. The lookup table values may be calculated using a computational software simulation, such as a MATLAB simulation, of each integer decibel value within the dynamic range of the receiver at a 0 dB signal-to-noise ratio (SNR). The resulting simulated peak and mean values are curve-fitted to smooth out the randomness of noise so that as the decibel level decreases, so does the simulated peak magnitude and the simulated threshold values.

If it is determined that the signal is a "signal present" case, then a max value compare table is used to compare the actual peak magnitude with simulated peak magnitude levels. A calculation table may calculate a first set of simulated peak magnitude levels, which includes the simulated peak magnitudes for each signal decibel level within the dynamic range of the receiver over a plurality of signal-to-noise ratios. Then the maximum of the first set of simulated peak magnitudes for each signal decibel level is determined, and the resulting second set of simulated peak magnitudes (one for each signal decibel level) is stored in the max value compare table. The comparison begins with the largest simulated peak magnitude, which should correspond with the simulated signal with the greatest decibel level. For the first occurrence in which the actual peak magnitude is greater than the simulated peak magnitude, a value representing the corresponding signal decibel level is then output into a variance compare table. In a "noise only" case, the output of the max value compare table represents a 0 dB SNR case. In a "signal present" case, if the peak is greater than the largest stored peak magnitude value for the simulated signal at the largest decibel level stored in the max value compare table, address 1 is the output, and if the peak is between the largest peak magnitude stored and the second largest peak magnitude stored, the address output is 2, etc. The address points to a set of variance values for a simulated signal at one decibel level and a plurality of SNRs, as is stored in the variance compare table.

Simulated variances stored in the variance compare table may also be developed in a computational software simulation. The table contains, for each possible decibel level of the signal, variance values for each possible decibel noise floor level. The variance compare table component outputs a value representing a noise level associated with the first simulated variance at which the actual variance is less than or equal to the simulated variance.

The noise level output by the variance compare table is sent to a BNE seed lookup table and is used to solve for "x" in an equation of the form magnitude=20 log$_{10}$(x)–82, where 82 can be replaced with any compensation value needed for a particular receiver to adjust for gains and losses on the front end, and magnitude is the noise level output by the variance compare table. If the actual variance is greater than the greatest stored variance at the determined signal decibel level, then the largest noise floor is assumed and therefore the largest BNE seed value will then be selected from the BNE seed look up table.

Other aspects and advantages of the present invention will be apparent from the following detailed description of the preferred embodiments and the accompanying drawing figures.

BRIEF DESCRIPTION OF THE DRAWING FIGURES

A preferred embodiment of the present invention is described in detail below with reference to the attached drawing figures, wherein:

FIG. 1 is a chart showing the results of picking a BNE seed that is too low;

FIG. 2 is a chart showing the results of picking a BNE seed that is too high;

FIG. 3 is a chart showing the results of picking a BNE seed that is too high when a continuous wave (CW) is present;

Figure 4:
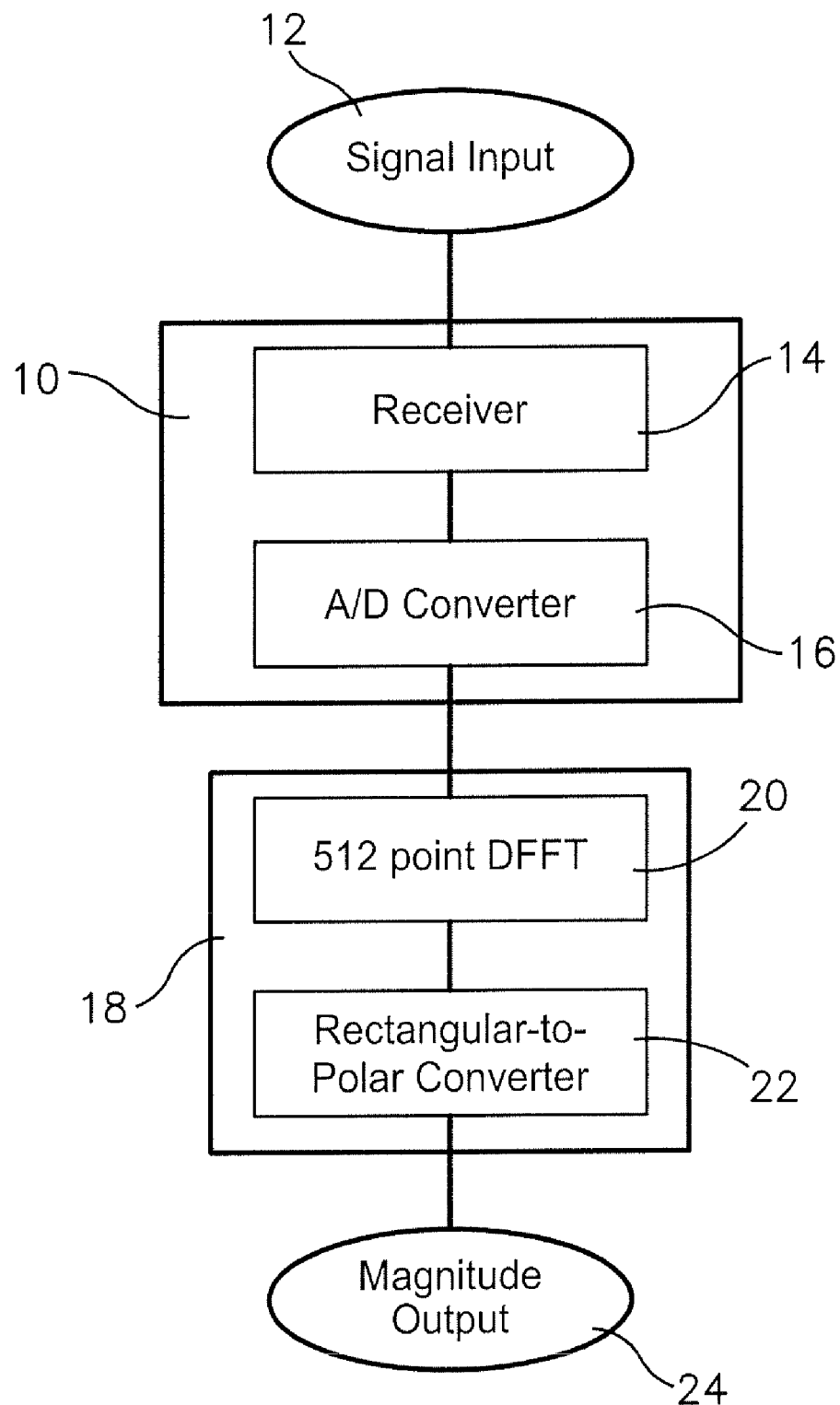
FIG. 4 is a block diagram of the signal sampling component and the magnitude calculator according to an embodiment of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 5:
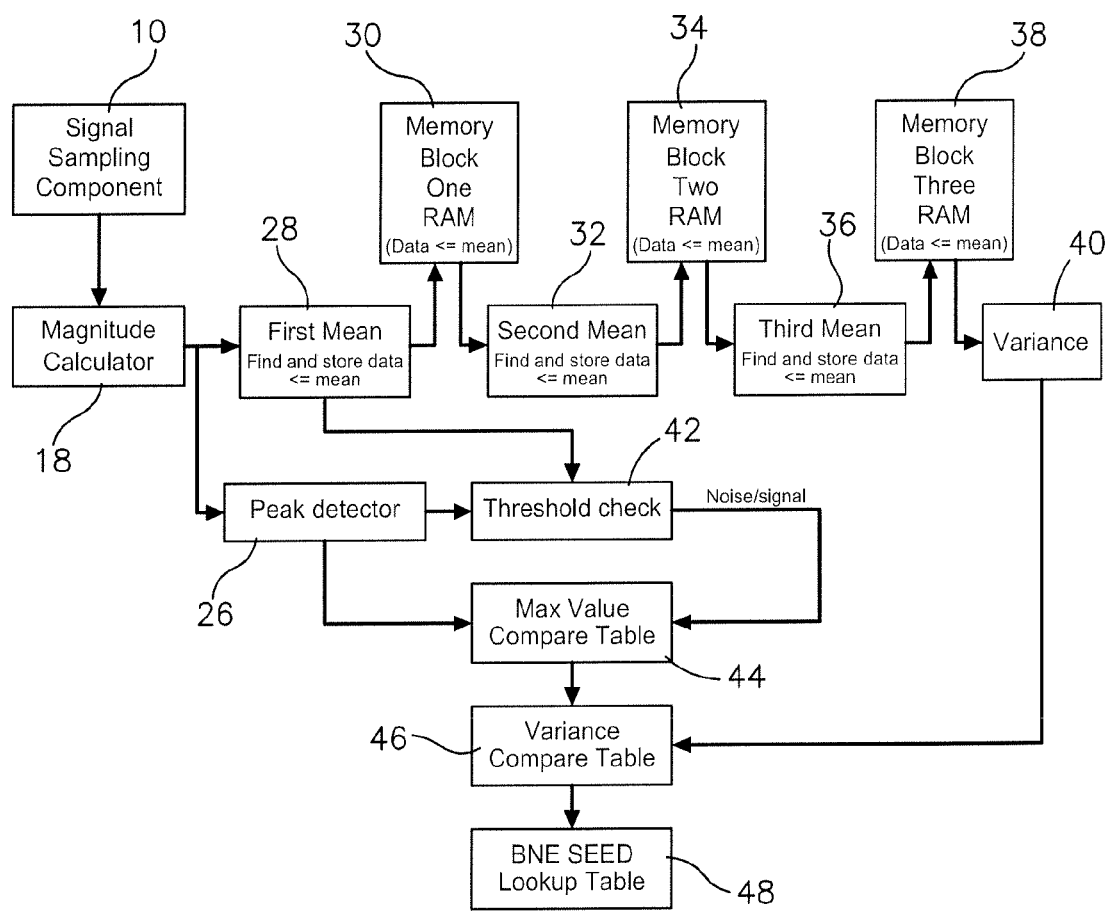
FIG. 5 is a block diagram of the BNE seed calculator, including the signal sampling component and the magnitude calculator of FIG. 4, according to an embodiment of the present invention.

FIG. 5 illustrates a block diagram of the automatic background noise estimator (BNE) seed calculator constructed in accordance with an embodiment of the present invention. The BNE seed calculator may be used for determining a starting point for a BNE circuit which tracks the noise floor of a signal. Referring to FIG. 5, the BNE seed calculator may be implemented with hardware components, such as on a field programmable gate array (FPGA) circuit or another type of circuit using memory and processing elements, or as a software application using any programming language known in the art to implement the BNE seed calculator on a hardware device. The BNE seed calculator may perform a method comprising sampling a plurality of data points; calculating the actual magnitude of each data point; determining the actual peak magnitude, a plurality of actual mean values, and the actual variance of the sampled points; and comparing the actual peak, actual mean, and the actual variance values with simulated values stored in comparison tables in order to determine the optimum BNE seed value.

A signal sampling component 10, as illustrated in FIGS. 4-5, for carrying out the step of sampling a plurality of data points of an input signal 12, may comprise a receiver 14, which may be any receiver known in the art for converting any type of signal, such as sound, light, electromagnetic waves, electrical signal, etc. into a usable electrical format. Examples of a receiver may include, but are not limited to microphones, radio receivers, etc. The signal sampling component 10 may also comprise an analog-to-digital converter 16, such that the signal received by the receiver is stored as a plurality of digital data points. In one example, 512 data points are sampled in a period before a data collection period.

A magnitude calculating component 18 for calculating the magnitude of each data point may be operable to calculate a complex discrete fast fourier transform (DFFT) 20 of the data points to convert the data points from the time domain to the frequency domain. However, any method for converting the data points from the time domain to the frequency domain may be used. The magnitude calculating component 18 may also comprise a rectangular-to-polar converter 22 implemented with a cordic algorithm to convert the real and imaginary components into polar coordinates and thereby solve for the output magnitudes 24, also referenced herein as the actual magnitudes of the data points. However, any method may be used to calculate the actual magnitudes of the data points.

A peak detector 26 may determine an actual peak magnitude of the plurality of data points. Simultaneously, a first mean-calculating component 28 may calculate a first actual mean for the actual magnitudes of the data points and then output all data less than or equal to the first actual mean into a first memory block 30, which may be RAM or any type of data storage device known in the art. A second mean-calculating component 32 may calculate a second actual mean for the actual magnitudes stored in the first memory block 30 and then output all data less than or equal to the second actual mean into a second memory block 34, which may also be RAM or any type of data storage device known in the art. A third mean-calculating component 36 may calculate a third actual mean value for the actual magnitudes stored in the second memory block 34 and then output all data less than or equal to the third actual mean value into a third memory block 38, which may be RAM or any type of data storage device known in the art. A variance calculating component 40 may then calculate the actual variance of the data stored in the third memory block 38 by summing the square of the deviation of each actual magnitude in the third memory block 38 from the actual third mean, then dividing the result by the number of data points used. The variance equation, as known in the art, may be written as shown:

$$\sigma^2 = \Sigma(X-\mu)^2/N$$

Where
  $\sigma^2$ is the variance,
  $\mu$ is the mean,
  X is the magnitude of each value, and
  N is the number of magnitudes used in the calculation.

Note that though three actual means are used in this embodiment of the invention, the mean-calculating steps, including storing the actual magnitudes equal to or less than the actual mean and using those stored values to calculate a subsequent actual mean, may be repeated more or fewer times than the above embodiment. For example, another embodiment of the invention may only calculate a second actual mean, and use the actual magnitude values of the second memory block 34 and the second actual mean to calculate the actual variance. The purpose of calculating a plurality of actual means is to minimize the effect of the spectral energy of any pulses or CW signals that may be present.

In various embodiments of the invention, the first mean-calculating component 28 may send a first actual mean value to a threshold checking component 42. The threshold checking component 42 may also receive, as input, the actual peak magnitude from the peak detector 26. The threshold checking component 42 may first calculate the difference between the actual peak magnitude and the first actual mean value, thereby defining an actual threshold value. Then the threshold checking component 42 may compare the actual peak magnitude and the actual threshold value to a set of 0 dB signal-to-noise (SNR) simulated peak magnitudes and simulated threshold values stored in a threshold checking compare table within the threshold checking component 42 to determine if the input signal should be categorized as a "noise only" or a "signal present" case.

The threshold checking compare table stores a simulated peak magnitude for a simulated signal for each integer decibel value within the dynamic range of the receiver at a 0 dB signal-to-noise ratio (SNR). The threshold checking compare table also stores the corresponding simulated threshold value for each simulated peak magnitude. In other words, the simulated threshold values represent the difference between the simulated peak and the simulated mean at 0 dB SNR.

The simulated signal may be a random noise vector calculated by signal processing software, such as MATLAB. Additionally, multiple random noise vectors may be simulated, and the peak magnitude and mean values for each random noise vector may be averaged. As the decibel value of the simulated signal decreases, the simulated peak magnitude and the simulated threshold should also decrease. However, because of the randomness of noise, values which do not follow this downward trend may need to be curve fitted in order for the threshold checking comparator to provide useful results.

The threshold checking component 42 may first compare the actual peak magnitude with each simulated peak magnitude value in the threshold checking compare table, starting with the largest simulated peak magnitude value. If the actual peak magnitude is larger than the largest simulated peak magnitude value, then the threshold checking component outputs a "signal present" signal. If the actual peak magnitude is less than or equal to the simulated peak magnitude value it is being compared to, then the next simulated peak magnitude is compared with the actual peak magnitude. For the first occurrence in which the actual peak magnitude is greater than the simulated peak magnitude value, the comparator then compares the actual threshold with the particular simulated threshold that corresponds to that simulated peak magnitude. If the actual threshold is greater than the simulated threshold, a "signal present" signal is output from the threshold checking component. Otherwise, a "noise only" signal is output from the threshold checking component. Also, if the actual peak magnitude is less than or equal to the smallest simulated peak magnitude, then a "noise only" signal is output from the threshold checking component.

Table 1 below is an example of a threshold check compare table at 0 dB SNR.

| Simulated Signal dB | Simulated peak mag. | Simulated mean | Simulated threshold |
|---|---|---|---|
| −14 | $P_{-14}$ | $M_{-14}$ | $Th_{-14}$ |
| −15 | $P_{-15}$ | $M_{-15}$ | $Th_{-15}$ |
| −16 | $P_{-16}$ | $M_{-16}$ | $Th_{-16}$ |
| −17 | $P_{-17}$ | $M_{-17}$ | $Th_{-17}$ |
| −18 | $P_{-18}$ | $M_{-18}$ | $Th_{-18}$ |
| −19 | $P_{-19}$ | $M_{-19}$ | $Th_{-19}$ |
| −20 | $P_{-20}$ | $M_{-20}$ | $Th_{-20}$ |

In Table 1 above, for example, if $P_{-14}$ is less than the actual peak magnitude, then a "signal present" signal is output by the threshold checking component 42. If $P_{-14}$ is greater than or equal to the actual peak magnitude, then the next simulated peak magnitude value in the table is compared. If $P_{-15}$ is greater than or equal to the actual peak magnitude, then the next simulated peak magnitude value in the table is compared. However, if $P_{-15}$ is less than the actual peak magnitude, then simulated threshold and the actual threshold are compared. If $Th_{-15}$ is less than the actual threshold, then a "signal present" signal is output by the threshold checking component 42, but if $Th_{-15}$ is greater than or equal to the actual threshold, then a "noise only" signal is output by the threshold checking component 42.

The output from the threshold checking component 42 and the peak detector 26 may be used as input values for a max value compare table component 44. The max value compare table component 44 compares the actual peak magnitude to values in a max value compare table, which comprises values corresponding to a set of simulated peak magnitudes calculated from simulated signals with a plurality of SNRs, then outputs an address value. In various embodiments of the invention, the address value output is 0 if the input from the threshold checking component is a "noise only" signal. Otherwise, the address may be a number anywhere from 1 to the max number of integer decibel values within the dynamic range of the receiver. For example, if the range of the receiver extends from −14 dB down to −70 dB, then the output address may be any value from 0 to 56.

Because a plurality of SNRs are used in the simulations to determine the set of simulated peak magnitudes for the max value compare table, these values may differ with the 0 dB SNR simulated peak magnitudes used by the threshold checking component 42. To determine the simulated peak magnitudes to store into the max value compare table, a calculation table may be created which stores a first set of simulated peak magnitude values of a simulated signal at each integer decibel value for each integer decibel noise floor value within the dynamic range of the receiver. In other words, a peak magnitude for each possible positive SNR situation is determined. For situations in which the dynamic level of the noise floor is greater than the dynamic level of the signal, the calculation table may be assigned a zero for the maximum magnitude value, so that the simulated peak magnitude calculated and used by the max value compare table is a peak magnitude of the signal at a particular dynamic level (decibel level) and not of the noise. As before, the simulated signal may be a random noise vector created in signal processing software, and multiple random noise vectors may be simulated and their peak magnitudes may be averaged for each SNR case to calculate each value for the calculation table.

Table 2 below is an example of the calculation table which may be used to develop values for the max value compare table. In this example, $P_{s,n}$ represents the simulated peak "P" for signal "s" and noise "n".

| NOISE | SIGNAL | | | | | | |
|---|---|---|---|---|---|---|---|
| | $-14$ | $-15$ | $-16$ | $-17$ | $-18$ | $-19$ | $-20$ |
| $-14$ | $P_{-14,-14}$ | 0 | 0 | 0 | 0 | 0 | 0 |
| $-15$ | $P_{-14,-15}$ | $P_{-15,-15}$ | 0 | 0 | 0 | 0 | 0 |
| $-16$ | $P_{-14,-16}$ | $P_{-15,-16}$ | $P_{-16,-16}$ | 0 | 0 | 0 | 0 |
| $-17$ | $P_{-14,-17}$ | $P_{-15,-17}$ | $P_{-16,-17}$ | $P_{-17,-17}$ | 0 | 0 | 0 |
| $-18$ | $P_{-14,-18}$ | $P_{-15,-18}$ | $P_{-16,-18}$ | $P_{-17,-18}$ | $P_{-18,-18}$ | 0 | 0 |
| $-19$ | $P_{-14,-19}$ | $P_{-15,-19}$ | $P_{-16,-19}$ | $P_{-17,-19}$ | $P_{-18,-19}$ | $P_{-19,-19}$ | 0 |
| $-20$ | $P_{-14,-20}$ | $P_{-15,-20}$ | $P_{-16,-20}$ | $P_{-17,-20}$ | $P_{-18,-20}$ | $P_{-19,-20}$ | $P_{-20,-20}$ |

Using the calculation table, such as the example in Table 2, the maximum of the first set of simulated peak magnitudes for each signal decibel level is determined, and a resulting second set of simulated peak magnitudes (one for each signal decibel level) is stored in the max value compare table. So, for example in Table 2, if the $P_{-15,-17}$ value is greater than any other value in the calculation table for the signal column $-15$ dB, then that value is determined to be $P_{-15}$ the simulated peak magnitude value used for the max value compare table, which, for example, could contain values $P_{-14}$ down to $P_{-20}$.

Once the second set of simulated peak magnitudes for each decibel level is determined, they may be adjusted or curve-fitted to account for the randomness of noise such that each subsequent value in the max value compare table is smaller than the previous value. The max value compare table component may compare the actual peak magnitude with each value in the max value compare table, beginning with the largest value, typically associated with the largest dynamic level. For the first occurrence at which the actual peak magnitude value is greater than the simulated peak magnitude value in the max value compare table, an address representing a corresponding signal decibel level is output.

The output of the max value compare table component 44 is input into a variance compare table component 46 comprising a variance compare table which is populated with variance values calculated for simulated signals at each integer decibel level and each integer decibel noise floor level within the dynamic range of the receiver. Table 3 below is an example of a variance compare table, with the columns representing the noise floor decibel values and the rows representing the simulated signal's decibel value. The simulated variance $V_{s,n}$ in the table below is labeled in terms of signal "s" and noise "n".

The actual variance is compared with each simulated variance determined for the simulated signal at the signal decibel level represented by the output of the max value compare table component 44. For the first occurrence at which the actual variance is less than or equal to the simulated variance, the corresponding noise floor level is output, or an address representing the corresponding noise floor level is output. If address zero is input into the variance compare table, or in other words, if the threshold check component output was a "noise only" signal, then the variance for each 0 dB SNR case is compared with the actual variance.

The comparison of the actual variance to the simulated variances begins with the smallest variance value, which should be the variance value with the smallest noise floor. So for example, if the max value compare table component 44 output an address representing $-16$ dB, such as address 3 in the table above, then the actual variance would first be compared with $V_{-16,-20}$ to determine if the actual variance is less than or equal to the simulated variance. If the actual variance is greater than the simulated variance, then $V_{-16,-19}$ is compared with the actual variance. If the actual variance is less than or equal to $V_{-16,-19}$, then a value representing the noise floor level $-19$ dB is output from the variance compare table component 46.

If the actual variance is greater than each simulated variance corresponding with the dynamic level denoted by the input, then the output will correspond with the greatest possible noise floor level. So, in the example table 3, the output will represent a noise floor dynamic level of $-14$ dB if the actual variance is greater than each simulated variance for a particular dynamic level of the signal.

The output of the variance compare table component 46 is input into a BNE seed lookup table. The look-up table provides a BNE seed value for each noise floor dynamic level input. The BNE seed value can be approximated to the nearest integer using the following equation:

$$Mag = 20 \log_{10} x - 82$$

| SIGNAL | | NOISE | | | | | | |
|---|---|---|---|---|---|---|---|---|
| | | $-14$ | $-15$ | $-16$ | $-17$ | $-18$ | $-19$ | $-20$ |
| 0 dB SNR | Address 0 | $V_{-14,-14}$ | $V_{-15,-15}$ | $V_{-16,-16}$ | $V_{-17,-17}$ | $V_{-18,-18}$ | $V_{-19,-19}$ | $V_{-20,-20}$ |
| $-14$ | Address 1 | $V_{-14,-14}$ | $V_{-14,-15}$ | $V_{-14,-16}$ | $V_{-14,-17}$ | $V_{-14,-18}$ | $V_{-14,-19}$ | $V_{-14,-20}$ |
| $-15$ | Address 2 | $V_{-15,-14}$ | $V_{-15,-15}$ | $V_{-15,-16}$ | $V_{-15,-17}$ | $V_{-15,-18}$ | $V_{-15,-19}$ | $V_{-15,-20}$ |
| $-16$ | Address 3 | $V_{-16,-14}$ | $V_{-16,-15}$ | $V_{-16,-16}$ | $V_{-16,-17}$ | $V_{-16,-18}$ | $V_{-16,-19}$ | $V_{-16,-20}$ |
| $-17$ | Address 4 | $V_{-17,-14}$ | $V_{-17,-15}$ | $V_{-17,-16}$ | $V_{-17,-17}$ | $V_{-17,-18}$ | $V_{-17,-19}$ | $V_{-17,-20}$ |
| $-18$ | Address 5 | $V_{-18,-14}$ | $V_{-18,-15}$ | $V_{-18,-16}$ | $V_{-18,-17}$ | $V_{-18,-18}$ | $V_{-18,-19}$ | $V_{-18,-20}$ |
| $-19$ | Address 6 | $V_{-19,-14}$ | $V_{-19,-15}$ | $V_{-19,-16}$ | $V_{-19,-17}$ | $V_{-19,-18}$ | $V_{-19,-19}$ | $V_{-19,-20}$ |
| $-20$ | Address 7 | $V_{-20,-14}$ | $V_{-20,-15}$ | $V_{-20,-16}$ | $V_{-20,-17}$ | $V_{-20,-18}$ | $V_{-20,-19}$ | $V_{-20,-20}$ |

Where

Mag is the decibel value corresponding to the input from the variance compare table component, and x is the BNE seed value.

Note that while 82 is subtracted from the logarithmic component of this equation, this is simply a compensation value used in this particular example. This value may be replaced with another value depending on the gain or loss of a particular receiver system.

Although the invention has been described with reference to the preferred embodiment illustrated in the attached drawing figures, it is noted that equivalents may be employed and substitutions made herein without departing from the scope of the invention as recited in the claims. For example, while the blocks illustrated in FIG. 5 are referred to throughout as "components", it should be understood that the processes performed by each component of the BNE seed calculator may be performed by any means known in the art. For example, the steps performed by the components illustrated in FIG. 5 may be performed by a central processing unit in a software implementation without departing from the scope of the present invention.

Having thus described an embodiment of the invention, what is claimed as new and desired to be protected by Letters Patent includes the following:

1. Circuitry for calculating a starting value for a background noise estimator circuit, said circuitry comprising:
   a signal processing component for outputting a plurality of actual magnitudes representing a plurality of data points;
   a first mean-calculating component for calculating an actual first mean of the magnitudes from the signal processing component;
   a variance calculating component for calculating an actual variance of at least a portion of the magnitudes from the signal processing component;
   a peak detector for determining the actual peak magnitude value of the data points;
   a max value compare table component which compares the actual peak magnitude to a plurality of simulated peak magnitudes and outputs an address corresponding with a dynamic level of a simulated signal;
   a variance compare table component which compares the actual variance with a plurality of simulated variances of a signal simulated at the dynamic level output by the max value compare table for a plurality of noise floor dynamic levels, wherein the output of the variance compare table component represents the noise floor of the simulated variance that corresponds with the actual variance; and
   a BNE seed lookup table wherein a BNE seed value is determined based on the noise floor associated with the output from the variance compare table component.

2. The circuitry of claim 1, further comprising:
   a first memory block for storing all magnitude values equal to or less than the actual first mean;
   a second mean-calculating component for calculating an actual second mean of the magnitude values stored in the first memory block;
   a second memory block for storing all magnitudes equal to or less than the actual second mean;
   a third mean-calculating component for calculating an actual third mean of the magnitude values stored in the second memory block; and
   a third memory block for storing all magnitude values equal to or less than the actual third mean;
   wherein the variance calculating component calculates the actual variance of the data points with actual magnitudes equal to or less than the actual third mean.

3. The circuitry of claim 1, further comprising a threshold checking component for
   calculating an actual threshold, which is the difference between the actual peak magnitude and the actual first mean magnitude;
   calculating a plurality of simulated thresholds, which each equal the difference between a simulated peak magnitude and a simulated mean obtained from at least one simulated signal at 0 dB signal-to-noise ratio for a plurality of dynamic levels;
   selecting one of the plurality of simulated thresholds corresponding to the first simulated peak magnitude determined to be less than the actual peak magnitude;
   comparing the simulated threshold with the actual threshold;
   outputting a first signal to the max value compare table component if the actual threshold is greater than the simulated threshold; and
   outputting a second signal to the max value compare table component if the actual threshold is less than or equal to the simulated threshold.

4. The circuitry of claim 3, wherein the max value compare table component comprises:
   a calculation table for storing a first set of simulated peak magnitudes, wherein the first set of simulated peak magnitudes are the peak magnitude values of a simulated signal calculated for each of a plurality of non-negative signal-to-noise ratios within a dynamic range; and
   a max value compare table for storing a second set of simulated peak magnitudes, one for each simulated signal dynamic level, wherein the second set of simulated peak magnitudes are maximum values in the calculation table for each simulated signal dynamic level.

5. The circuitry of claim 4, wherein the for the first occurrence at which the actual peak magnitude value is greater than the simulated peak magnitude value in the max value compare table, the max value compare table component outputs an address representing the simulated signal dynamic level corresponding to that simulated peak magnitude.

6. The circuitry of claim 4, wherein the max value compare table component automatically outputs an address corresponding with a 0 dB signal-to-noise ratio signal simulation if the max value compare table component receives the second signal as input.

7. The circuitry of claim 6, wherein, when the variance compare table component receives the address corresponding with a 0 dB signal-to-noise ratio signal simulation, the variance compare table component compares the actual variance with a plurality of simulated variances of a signal simulated at a 0 dB signal-to-noise ratio for a plurality of dynamic levels within the dynamic range.

8. The circuitry of claim 7, wherein of the actual variance is compared with a plurality of simulated variances corresponding with the input from the max value compare table component, beginning with the smallest simulated variance value, and the variance compare table component's output represents the noise floor of the simulated signal at which the actual variance is first less than or equal to the simulated variance.

9. The circuitry of claim 1, wherein the signal processing component further comprises:
   a sampling component for obtaining a plurality of discrete data points from an input signal; and
   a magnitude calculator for converting the data points from time domain values to frequency domain values and calculating the magnitude of each data point, wherein the magnitude calculator uses a discrete fast fourier transform to convert the data points into rectangular coordinates in the frequency domain.

10. The circuitry of claim 9, wherein the rectangular coordinates are converted to polar coordinates, thereby calculating the magnitudes of the data points, by means of a rectangular-to-polar converter implemented with a cordic algorithm.

11. The circuitry of claim 9, wherein the sampling component further comprises a receiver for receiving the signal and an analog-to-digital converter for converting the signal into discrete data points.

12. The circuitry of claim 1, wherein the simulated values are simulated in signal processing software.

13. The circuitry of claim 1, wherein the simulated signal is a random noise vector.

14. A method for calculating a starting value for a background noise estimator circuit, said method comprising:
   sampling an actual signal with signal sampling circuitry to obtain a plurality of discrete data points from an input signal;
   calculating actual magnitudes for each data point in the frequency domain with magnitude calculating circuitry;
   calculating an actual first mean of the actual magnitudes with mean-calculating circuitry;
   calculating an actual variance of at least a portion of the data points with variance calculating circuitry;
   determining the actual peak magnitude value of the data points with peak detector circuitry;
   comparing the actual peak magnitude to a plurality of simulated peak magnitudes, beginning with the largest simulated peak magnitude with max value circuitry;
   determining a first signal decibel level associated with the first simulated peak magnitude determined to be less than the actual peak magnitude comparing the actual variance with the simulated variances, beginning at the smallest simulated variance, of a signal simulated at the first signal decibel level for a plurality of noise floors;
   determining a first noise floor decibel level associated with the first simulated variance determined to be greater than or equal to the actual variance; and
   looking up a BNE seed value in a BNE seed lookup table based on the first noise floor decibel level.

15. The method of claim 14, further comprising:
   storing all magnitude values equal to or less than the actual first mean in a first memory block;
   calculating an actual second mean of the magnitude values stored in the first memory block;
   storing all magnitudes equal to or less than the actual second mean in a second memory block;
   calculating an actual third mean of the magnitude values stored in the second memory block; and
   storing all magnitude values equal to or less than the actual third mean in a third memory block;
   wherein the actual third mean and data points stored in the third memory block are used to calculate the variance.

16. The method of claim 14, further comprising
   calculating an actual threshold, which is the difference between the actual peak magnitude and the actual first mean magnitude;
   calculating a plurality of simulated thresholds, which each equal the difference between a simulated peak magnitude and a simulated mean obtained from at least one simulated signal at 0 dB signal-to-noise ratio for a plurality of dynamic levels;
   selecting one of the plurality of simulated thresholds corresponding to the first simulated peak magnitude determined to be less than the actual peak magnitude;
   comparing the simulated threshold with the actual threshold;
   characterizing the actual signal as a "signal present" case if the actual threshold is greater than the simulated threshold; and
   characterizing the actual signal as a "noise only" case if the actual threshold is less than or equal to the simulated threshold.

17. The method of claim 14, wherein the simulated peak magnitudes are calculated by
   creating a calculation table for storing an initial set of simulated peak magnitudes, wherein the initial set of simulated peak magnitudes are the peak magnitude values of a simulated signal calculated for each of a plurality of non-negative signal-to-noise ratios within a dynamic range; and
   determining the peak magnitudes stored in the calculation table for each simulated signal dynamic level.

18. A method for determining an optimum background noise estimator seed value, comprising the steps of:
   sampling a plurality of data points with signal sampling circuitry;
   calculating an actual magnitude of each data point with magnitude calculating circuitry;
   determining an actual peak magnitude of the data points with threshold checking circuitry;
   calculating at least one actual mean of the magnitudes of the sampled points;
   calculating the actual variance of the sampled points; and
   comparing the actual peak magnitude, at least one actual mean, and the actual variance with corresponding simulated values stored in comparison tables;
   determining which simulated values most closely represent the actual sampled point values to determine the noise floor level of the data points and look up a BNE seed value based on the noise floor level.

19. The method of claim 18, further comprising
   calculating an actual threshold, which is the difference between the actual peak magnitude and the actual first mean magnitude;
   calculating a plurality of simulated thresholds, which each equal the difference between a simulated peak magnitude and a simulated mean obtained from at least one simulated signal at 0 dB signal-to-noise ratio for a plurality of dynamic levels;
   selecting one of the plurality of simulated thresholds corresponding to the first simulated peak magnitude determined to be less than the actual peak magnitude;
   comparing the simulated threshold with the actual threshold;
   characterizing the actual signal as a "signal present" case if the actual threshold is greater than the simulated threshold; and
   characterizing the actual signal as a "noise only" case if the actual threshold is less than or equal to the simulated threshold.

20. The method of claim 19, wherein if the signal is characterized as a "noise only" case, then the variances for each 0 dB signal-to-noise ratio within a dynamic range are compared with the actual variance to estimate the noise floor decibel level of the actual signal and determine what noise decibel level is used to look up the BNE seed value.

21. The method of claim 19, wherein if the signal is characterized as a "signal present" case, then the actual peak magnitude is compared with a plurality of simulated peak magnitudes to estimate the actual signal's decibel level, and for a simulated signal at that decibel level, a plurality of simulated variances for each possible noise floor is compared with the actual variance to estimate the actual signal's noise floor decibel level and determine what noise decibel level is used to look up the BNE seed value.

* * * * *